US012619169B2

(12) United States Patent

Jang

(10) Patent No.: US 12,619,169 B2

(45) Date of Patent: May 5, 2026

(54) APPARATUS FOR TREATING SUBSTRATE AND METHOD FOR TREATING A SUBSTRATE

(71) Applicant: SEMES CO., LTD., Cheonan-si (KR)

(72) Inventor: Ho Jin Jang, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 403 days.

(21) Appl. No.: 18/332,998

(22) Filed: Jun. 12, 2023

(65) Prior Publication Data

US 2024/0192611 A1      Jun. 13, 2024

(30) Foreign Application Priority Data

Dec. 12, 2022      (KR) ........................ 10-2022-0172468

(51) Int. Cl.
G03F 7/00            (2006.01)

(52) U.S. Cl.
CPC ...... G03F 7/70866 (2013.01); G03F 7/70908 (2013.01)

(58) Field of Classification Search
None
See application file for complete search history.

(56) References Cited

U.S. PATENT DOCUMENTS

| | | | | |
|---|---|---|---|---|
| 8,840,752 B2 * | 9/2014 | Ogata | ............... | H01L 21/67173 |
| | | | | 156/345.31 |
| 9,576,808 B2 * | 2/2017 | Masuhara | ......... | H01L 21/67115 |
| 2014/0238443 A1 * | 8/2014 | Lee | ..................... | H01L 21/6708 |
| | | | | 239/548 |

| | | | | |
|---|---|---|---|---|
| 2015/0034133 A1 * | 2/2015 | Kim | .................. | H01L 21/67051 |
| | | | | 134/105 |
| 2018/0333755 A1 * | 11/2018 | Lee | ........................ | B08B 7/0071 |
| 2022/0208568 A1 * | 6/2022 | Ha | ..................... | H01L 21/67051 |
| 2023/0184574 A1 * | 6/2023 | Yun | ......................... | G01F 23/02 |
| | | | | 118/712 |
| 2024/0192611 A1 * | 6/2024 | Jang | ................... | G03F 7/70908 |

FOREIGN PATENT DOCUMENTS

| | | |
|---|---|---|
| KR | 10-2005-0028457 A | 3/2005 |
| KR | 10-2005-0104694 A | 11/2005 |
| KR | 10-2012-0004921 A | 1/2012 |
| KR | 10-2018-0004362 A | 1/2018 |
| KR | 10-2018-0088285 A | 8/2018 |

OTHER PUBLICATIONS

Office Action for Korean Application No. 10-2022-0172468 dated Oct. 18, 2024.

* cited by examiner

*Primary Examiner* — Sylvia Macarthur

(74) *Attorney, Agent, or Firm* — Harness, Dickey & Pierce, P.L.C

(57) ABSTRACT

The inventive concept provides a substrate treating method at a treating space. The substrate treating method includes coating a substrate with a first liquid by supplying the first liquid to the substrate; and cleaning a substrate by supplying a second liquid to remove a portion of the first liquid remaining on a specific region of the substrate, the second liquid being different from the first liquid, and wherein an atmosphere of the treating space is exhausted while the coating of the substrate and the cleaning of the substrate is performed, and an exhausting pressure of the treating space during the coating of the substrate is different from an exhausting pressure of the treating space during the cleaning of the substrate.

6 Claims, 12 Drawing Sheets

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0172468 filed on Dec. 12, 2022, in the Korean Intellectual Property Office, the entire contents of which are hereby incorporated by reference.

TECHNICAL FIELD

Embodiments of the inventive concept described herein relate to a substrate treating apparatus and method, more specifically, a substrate treating apparatus and method for supplying a liquid to a substrate.

BACKGROUND

Various processes such as a photolithography process, an etching process, an ashing process, a thin film deposition process, and a cleaning process are performed to manufacture a semiconductor element or a flat plate display panel. Among these processes, the photolithography process involves sequentially or selectively performing a coating process of supplying a photoresist liquid to a semiconductor substrate to form a coating film on a substrate surface and an exposing process of exposing a coating layer using a mask, and then a developing process of obtaining a desired pattern on the semiconductor substrate by supplying a developing liquid.

In the coating process, a coating liquid must be uniformly coated on an entire region of the substrate. In a process of applying the coating liquid to the substrate in the coating process, the coating liquid may flow outside an edge region of the substrate. The coating liquid flowing outside the edge region of the substrate flows to a bottom surface of the edge region of the substrate and forms the liquid film on a bottom surface of the substrate. The liquid film formed on the bottom surface of the substrate may be a source of particles in a subsequent exposing process or the like. In addition, the liquid film formed on the bottom surface of the substrate acts as a factor which makes it difficult to treat a substrate uniformly in subsequent processes. Accordingly, a cleaning liquid is supplied to the bottom surface of the edge region of the substrate to remove the liquid film formed on the bottom surface of the substrate.

FIG. 1 is an enlarged view schematically illustrating a state in which the cleaning liquid is supplied to the bottom surface of the edge region of a substrate in a general substrate treating apparatus.

Referring to FIG. 1, the substrate treating apparatus 1000 may include a support 1100, a cup body 1200, and a back nozzle 1300.

The support 1100 supports and rotates the substrate W. In addition, the cup body 1200 surrounds the substrate W supported by the support 1100. In addition, the back nozzle 1300 sprays the cleaning liquid on the bottom surface of the edge region of the substrate W supported by the support 1100. In order to remove a liquid film formed on the bottom surface of the edge region of the substrate W, the back nozzle 1300 sprays the cleaning liquid onto the bottom surface of the edge region of the rotating substrate W. The cleaning liquid discharged to the edge region of the substrate W collides with the bottom surface of the substrate W. In the process of the substrate W colliding with the cleaning liquid, some of a residue of the liquid film formed on the bottom surface of the substrate W is attached to an inner wall of the cup body 1200. In particular, since the support 1100 rotates, a phenomenon in which the residue is attached to the inner wall of the cup body 1200 by a centrifugal force is intensified. The residue of the liquid film attached to the inner wall of the cup body 1200 is rebounded by the substrate W supported by the support 1100 to contaminate the substrate W. In addition, the residue of the liquid film is attached to the cup body 1200 and acts as a source of particles which contaminate a subsequent substrate W.

SUMMARY

Embodiments of the inventive concept provide a substrate treating apparatus and method for uniformly treating a substrate.

Embodiments of the inventive concept provide a substrate treating apparatus and method for minimizing a contamination with respect to a substrate which is currently being treated.

Embodiments of the inventive concept provide a substrate treating apparatus and method for minimizing a contamination with respect to a subsequent substrate.

The technical objectives of the inventive concept are not limited to the above-mentioned ones, and the other unmentioned technical objects will become apparent to those skilled in the art from the following description.

The inventive concept provides a substrate treating method at a treating space. The substrate treating method at a treating space includes coating a substrate with a first liquid by supplying the first liquid to the substrate; and cleaning a substrate by supplying a second liquid to remove a portion of the first liquid remaining on a specific region of the substrate, the second liquid being different from the first liquid, and wherein an atmosphere of the treating space is exhausted while the coating of the substrate and the cleaning of the substrate is performed, and an exhausting pressure of the treating space during the coating of the substrate is different from an exhausting pressure of the treating space during the cleaning of the substrate.

In an embodiment, the exhausting pressure of the treating space during the cleaning of the substrate is greater than the exhausting pressure of the treating space during the coating of the substrate.

In an embodiment, the exhausting pressure of the treating space is pre-emptively increased after the coating of the substrate is performed, and before the second liquid is supplied at the cleaning of the substrate.

In an embodiment, at the time of supplying of the second liquid at the cleaning of the substrate, the exhausting pressure of the treating space is increased.

In an embodiment, the exhausting pressure is applied in a direction toward a bottom surface of the substrate.

In an embodiment, the first liquid is supplied to a top surface of the substrate, and the second liquid is supplied to the bottom surface of the substrate.

In an embodiment, the first liquid is supplied to a central region of the top surface of the substrate, and the second liquid is supplied to an edge region of the bottom surface of the substrate.

In an embodiment, the substrate treating method further includes: drying the substrate by rotating the substrate, and wherein the atmosphere of the treating space is exhausted while the drying of the substrate is performed, and an exhausting pressure of the treating space at the drying of the substrate is lower than the exhausting pressure of the treating space at the cleaning of the substrate.

In an embodiment, the first liquid includes a photoresist liquid and the second liquid includes a thinner.

The inventive concept provides a substrate treating method. The substrate treating method includes supplying a photoresist liquid to a substrate positioned at a treating space; diffusing the photoresist liquid supplied to the substrate by rotating the substrate; cleaning a substrate by supplying a cleaning liquid to a bottom surface adjacent an edge region of the substrate to remove a portion of the photoresist liquid which has flowed down to the bottom surface adjacent the edge region of the substrate at the diffusing of the photoresist liquid; and drying the substrate by removing the cleaning liquid remaining on the substrate, and wherein an atmosphere of the treating space is exhausted while the supplying of the photoresist liquid, the diffusing of the photoresist liquid, the cleaning of the substrate, and the drying of the substrate are performed, and an exhausting pressure of the treating space is changed during one of the supplying of the photoresist liquid, diffusing of the photoresist liquid, the cleaning of the substrate, cleaning of the substrate and/or combinations thereof.

In an embodiment, the exhausting pressure of the treating space is changed after diffusing of the photoresist liquid and before cleaning of the substrate.

In an embodiment, the exhausting pressure of the treating space at the cleaning of the substrate is greater than the exhausting pressure of the treating space at the diffusing of the photoresist liquid.

In an embodiment, the exhausting pressure of the treating space is further changed after the cleaning of the substrate and before the drying of the substrate, and the exhausting pressure of the treating space at the drying of the substrate is lower than the exhausting pressure of the treating space at the cleaning of the substrate.

In an embodiment, the exhausting pressure of the treating space is preemptively increased between the diffusing of the photoresist liquid and the cleaning of the substrate and before supplying the cleaning liquid to the substrate.

In an embodiment, the exhausting pressure of the treating space is increased at the time of supplying of the cleaning liquid at the cleaning of the substrate.

In an embodiment, the exhausting pressure is applied in a direction toward a bottom surface of the substrate.

The inventive concept provides a substrate treating apparatus. The substrate treating apparatus includes a support unit configured to support and rotate a substrate; a treating container surrounding a substrate supported on the support and providing a treating space for treating the substrate within; an exhaust unit configured to combine with the treating space to exhaust an atmosphere of the treating space; a first liquid nozzle supplying a first liquid to the substrate supported on the support unit; a second liquid nozzle supplying a second liquid to the substrate supported on the support unit, the second liquid being different from the first liquid; and a controller configured to control the first liquid nozzle, the second liquid nozzle, and the exhaust unit so that the first liquid is supplied to a central region of a top surface of the substate rotating and then the second liquid is supplied to an edge region of a bottom surface of the substrate rotating, and an exhausting pressure of the treating space during the supplying of the first liquid is different from an exhausting pressure of the treating space during the supplying of the second liquid.

In an embodiment, the controller controls the exhaust unit so that the exhausting pressure of the treating space during the supplying of the second liquid is greater than the exhausting pressure of the treating space during the supplying of the first liquid.

In an embodiment, the controller controls the exhaust unit so that the exhaust pressure of the treating unit is preemptively increased after the supplying of the first liquid and before the supplying of the second liquid.

In an embodiment, the controller controls the exhaust unit to increase the exhausting pressure of the treating space at the time of supplying the second liquid to the substrate.

According to an embodiment of the inventive concept, a substrate may be uniformly treated.

According to an embodiment of the inventive concept, a contamination with respect to a substrate which is currently being treated may be minimized.

According to an embodiment of the inventive concept, a contamination with respect to a subsequent substrate may be minimized.

According to an embodiment of the inventive concept, a contamination with respect to a substrate may be without an accompaniment of a structural change of a facility.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a plan view schematically illustrating the substrate treating apparatus of FIG. 2.

FIG. 12 is an enlarged view schematically illustrating a state in which the substrate is treated in a drying step according to an embodiment.

5

Figure 13:
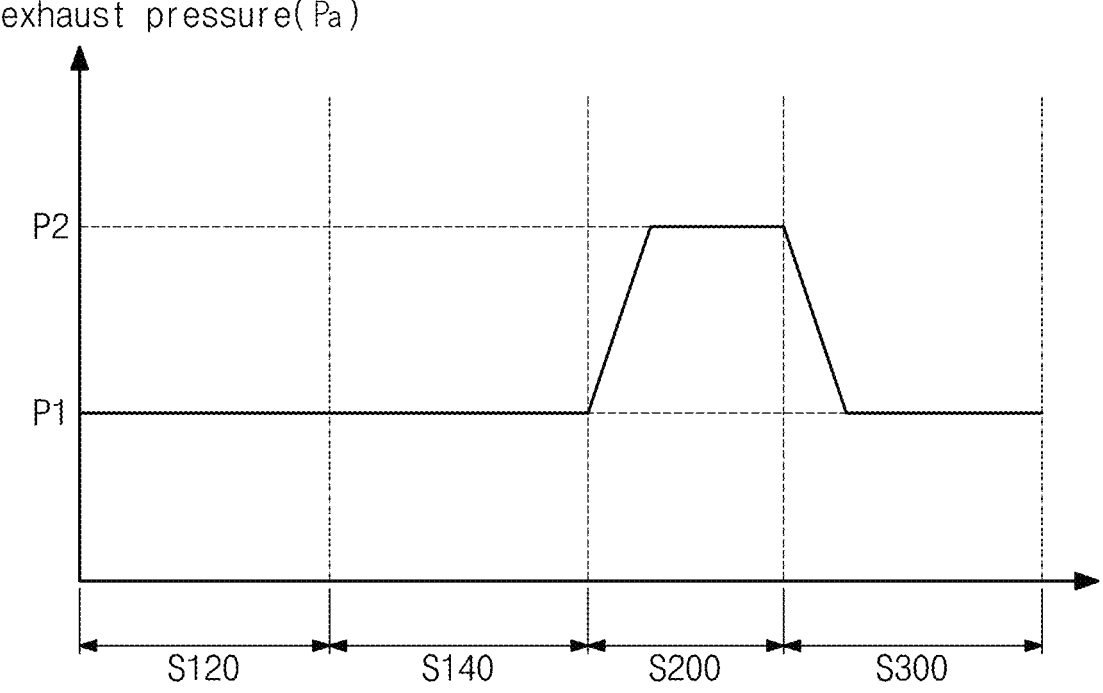

FIG. 13 is a graph illustrating a change in the exhaust pressure of the treating space in each step of the substrate treating method according to another embodiment.

DETAILED DESCRIPTION

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

The substrate according to an embodiment described below will be described with a circular substrate such as a semiconductor wafer as an example. However, the inventive concept is not limited thereto, and the substrate described in an embodiment of the inventive concept may be a rectangular substrate such as a mask or a display panel.

In an embodiment of the inventive concept, a substrate treating apparatus on which at least one of a coating process for forming a coating film on a surface of a substrate by supplying a photoresist liquid such as a photoresist liquid on the substrate, an exposure process for exposing with respect to the coating film, and a developing process for forming a desired pattern on the substrate may supplying a developing liquid on the substrate, is described as an example. However, the inventive concept is not limited to the above-described example, and the substrate treating apparatus according to an embodiment may be applied to various devices performing a predetermined process of the substrate.

Figure 1:
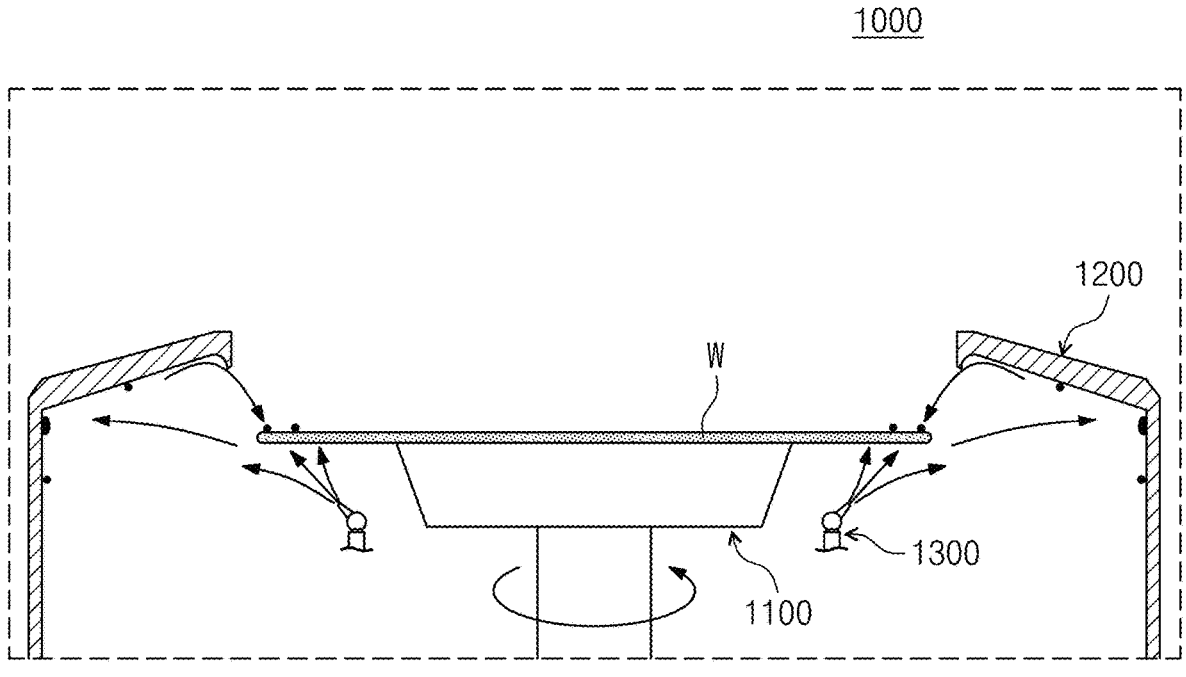
FIG. 1 is an enlarged view schematically illustrating a state in which a cleaning liquid is supplied to a bottom surface of an edge region of a substrate in a general substrate treating apparatus.
Figure 2:
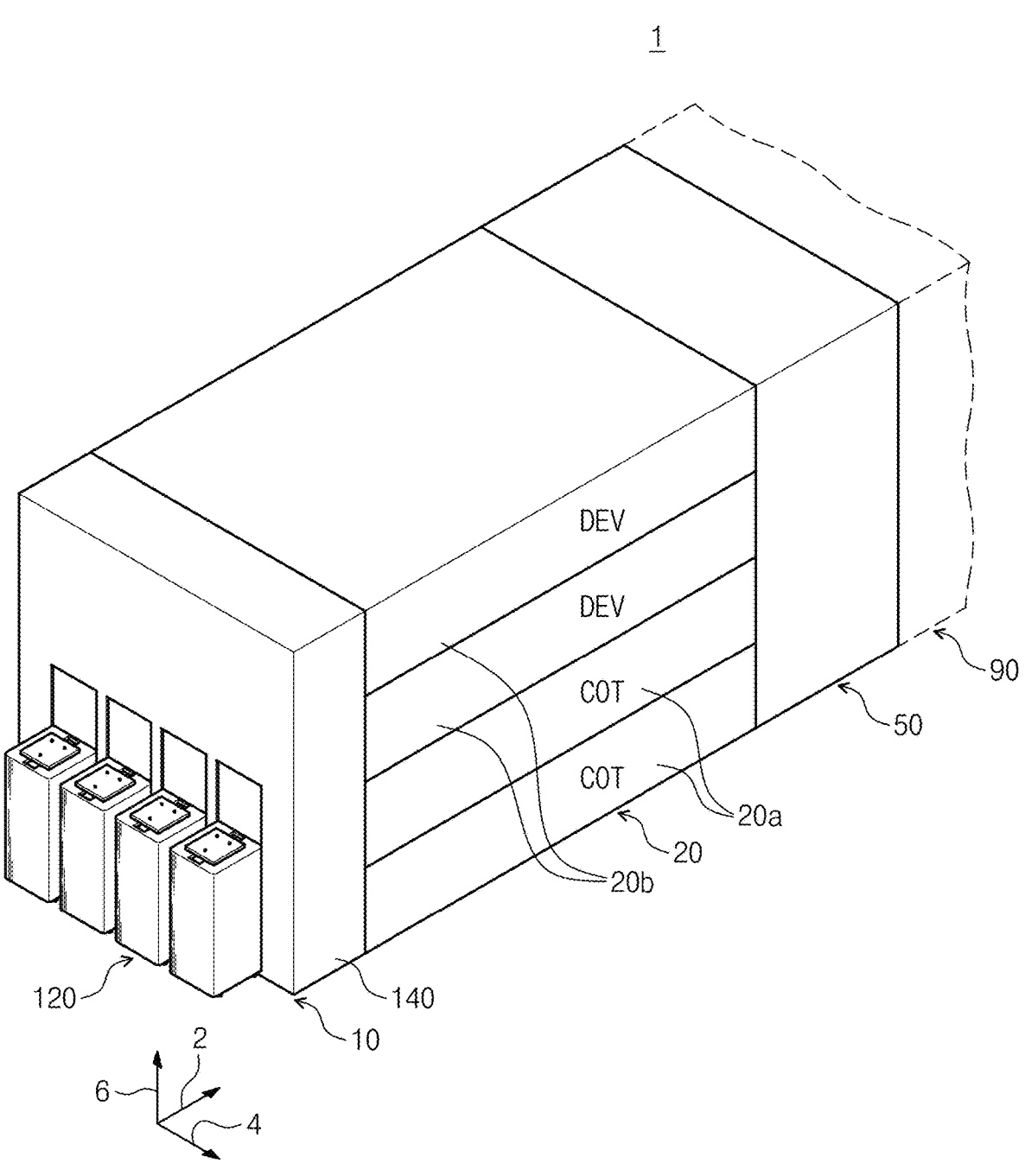
FIG. 2 is a perspective view schematically illustrating the substrate treating apparatus according to an embodiment.
Figure 3:
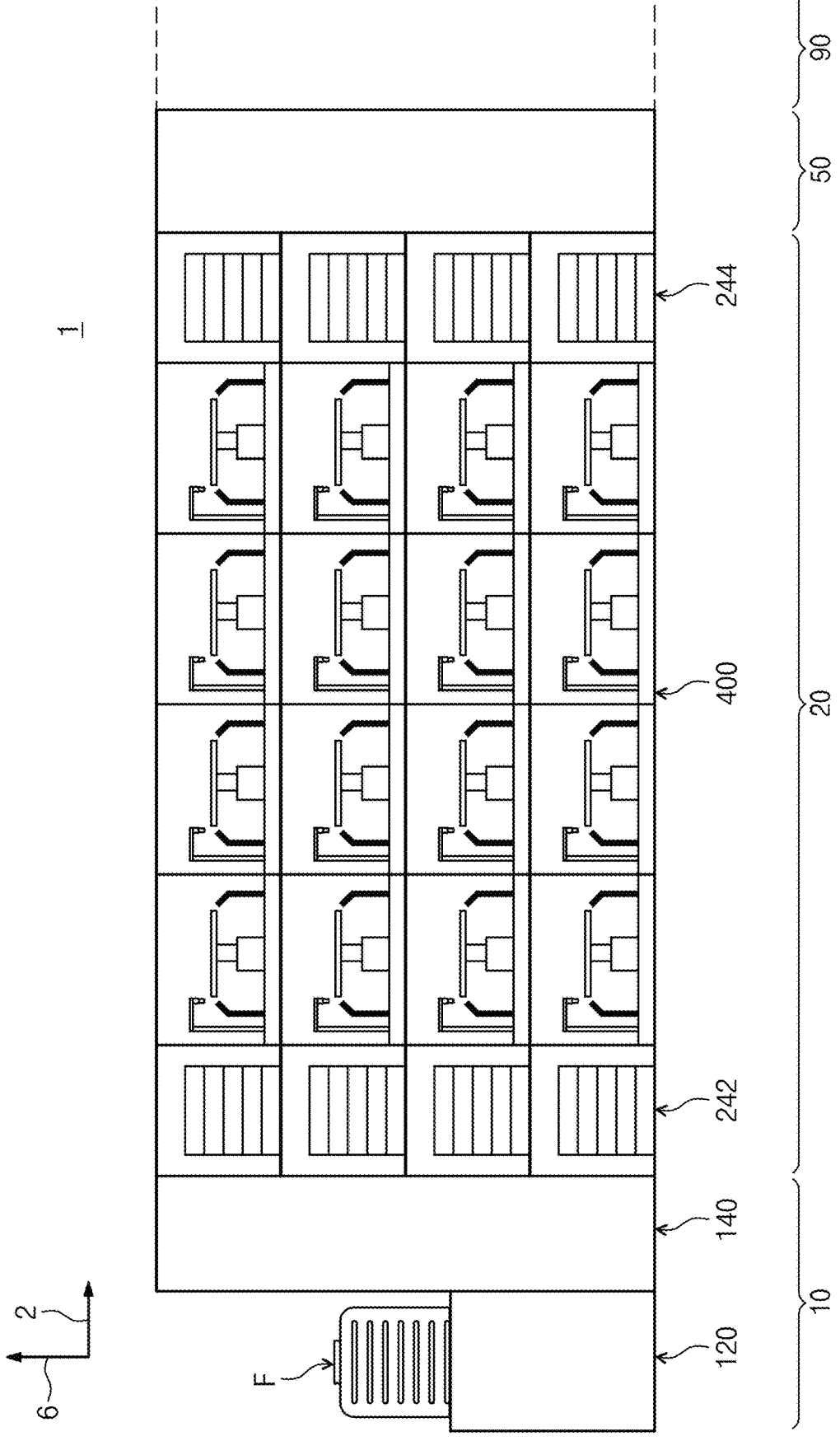
FIG. 3 is a cross-sectional view schematically illustrating a coating block or a developing block of FIG. 2.
Figure 4:
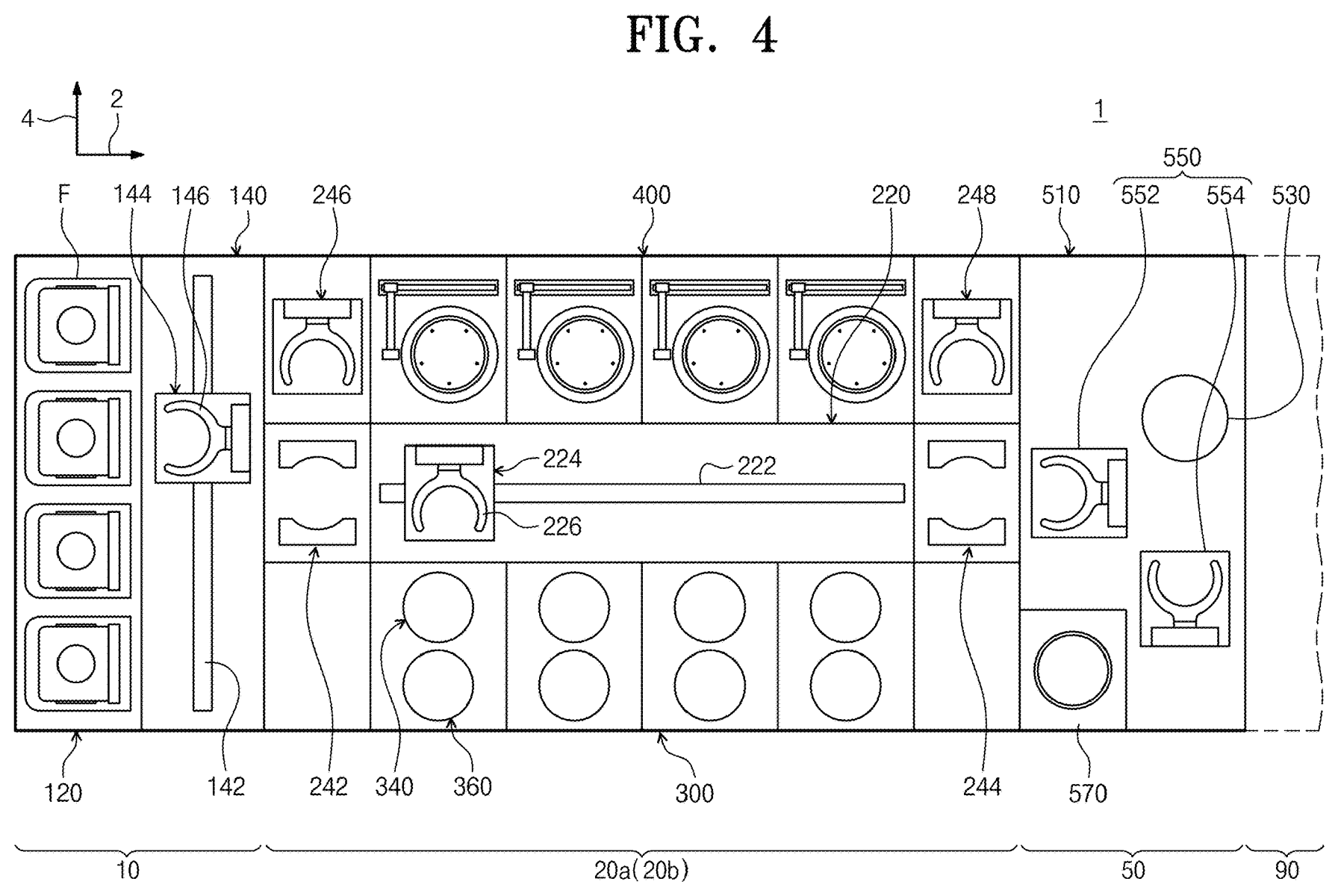

FIG. 2 is a perspective view schematically illustrating a substrate treating apparatus according to an embodiment. FIG. 3 is a cross-sectional view schematically showing the coating block or developing block of FIG. 2. FIG. 4 is a plan view schematically showing the substrate treating apparatus of FIG. 2.

The substrate treating apparatus 1 may include an index module 10, a treating module 20, and an interface module 50.

The index module 10, the treating module 20, and the interface module 50 are in a direction and sequentially positioned. Hereinafter, a direction in which the index module 10, the treating module 20, and the interface module 50 are disposed is defined as a first direction 2. Also, when viewed from above, a direction perpendicular to the first direction 2 is defined as a second direction 4, and a direction perpendicular to a plane including both the first direction 2 and the second direction 4 is defined as a third direction 6. For example, the third direction 6 may be a direction perpendicular to the ground.

The index module 10 transfers the substrate between container F and the treating module 20. More specifically, the index module 10 takes out the substrate from the container F and transfers the substrate which is taken out to the treating module 20 for treating the substrate. In addition, the index module 10 taken out the substrate on which a predetermined treatment has been completed from the treating module 20 and transfers the substrate to the container F. The index module 10 has a load port 120 and an index frame 140.

A container F in which the substrate is stored is accommodated in the load port 120. The load port 120 is disposed on an opposite side of the treating module 20 based on an index frame 140 to be described later. A plurality of load ports 120 may be provided, and the plurality of load ports 120 are positioned in a line along the second direction 4. The number of load ports 120 may increase or decrease according to a process efficiency or footprint conditions of the treating module 20.

The substrate is stored in the container F. As the container F stored in the load port 120 according to an embodiment, a sealing container such as a front opening unified pod (FOUP) may be used. The container F may be stored in the load port 120 by a means of transfer such as an overhead transfer, an overhead conveyor, or an automatic guided vehicle or by an operator.

The index frame 140 its lengthwise direction horizontal to the second direction 4. An index rail 142 and an index robot 144 are disposed inside the index frame 140. The index rail 142 its lengthwise direction parallel to the lengthwise direction of the index frame 140. The index robot 144 transfers the substrate. More specifically, the index robot 144 may transfer the substrate between the container F stored in the load port 120 and a front buffer 242 to be described later. The index robot 144 forwardly and backwardly moves on the index rail 142 along the lengthwise direction of the index rail 142.

The index robot 144 has an index hand 146. The substrate is placed on the index hand 146. The index hand 146 forwardly and backwardly moves, rotates about the third direction 6, and moves up and down along the third direction 6.

The treating module 20 perform a coating process and/or a developing process on the substrate. According to an embodiment, the treating module 20 may include a coating block 20a and a developing block 20b. The coating block 20a performs the coating process on the substrate. The developing block 20b performs a developing process on the substrate.

A plurality of coating blocks 20a and a plurality of developing blocks 20b may be provided, and the plurality of coating blocks 20a and the plurality of developing blocks 20b may be disposed to be stacked on each other. According to an embodiment, the coating blocks 20a may be disposed below the developing blocks 20b. In addition, each of the coating blocks 20a has the same or similar structure, and may perform the same or similar process. In addition, each of the developing blocks 20b has the same or similar structure, and may perform the same or similar process. However, the inventive concept is not limited thereto, and each coating block 20a may perform different processes, and each developing block 20b may perform different processes. In addition, the number and arrangement of the coating blocks 20a and the number and arrangement of the developing blocks 20b may be variously changed.

Since the coating block 20a and the developing block 20b according to an embodiment are generally configured to have the same or similar structure and arrangement with each other, a description of the developing block 20b will be omitted hereinafter, and the coating block 20a will be mainly described to avoid repeated explanations.

The coating block 20a has a transfer chamber 220, buffer chambers 242 and 244, a heat treating chamber 300, and a liquid treating chamber 400.

The transfer chamber 220 has its lengthwise direction parallel to the first direction 2. A guide rail 222 having its lengthwise direction parallel to the first direction 2 and a transfer robot 224 are disposed in the transfer chamber 220. The transfer robot 224 transfers the substrate between the buffer chambers 242 and 244, the heat treating chamber 300, and the liquid treating chamber 400. The transfer robot 224 forwardly and backwardly moves along the lengthwise direction of the guide rail 222 on the guide rail 222. The transfer robot 224 has a transfer hand 226 on which the substrate is placed. Since the structure of the transfer hand 226 has the same or similar structure as that of the index hand 146 described above, a redundant description thereof will be omitted.

The buffer chambers 242 and 244 provide a space at which the substrate taken into the coating block 20a and a substrate taken out from the coating block 20a temporarily remain. A plurality of buffer chambers 242 and 244 may be provided. Some of the buffer chambers 242 and 244 are disposed between the index frame 140 and the transfer chamber 220. Hereinafter, these buffer chambers are defined as front buffers 242. In addition, another portion of the buffer chambers 242 and 244 are disposed between the transfer chamber 220 and the interface module 50 to be described later. Hereinafter, these buffer chambers are defined as rear buffers 244. A plurality of front buffers 242 may be provided, and the plurality of front buffers 242 may be stacked in a vertical direction. In addition, the plurality of rear buffers 244 may be provided, and the plurality of rear buffers 244 may be stacked in a vertical direction.

Each of the front buffer 242 and the rear buffer 244 temporarily stores a plurality of substrates. A substrate stored in the front buffer 242 is taken in or taken out by the index robot 144 and the transfer robot 224. In addition, a substrate stored in the rear buffer 244 is taken in or taken out by the transfer robot 224 and the first robot 552 to be described later.

The buffer robots 246 and 248 may be disposed on a side of the buffer chambers 242 and 244. According to an embodiment, a front buffer robot 246 may be disposed on a side of the front buffer 242, and a rear buffer robot 248 may be disposed on a side of the rear buffer 244. However, the inventive concept is not limited thereto, and buffer robots may be disposed on both sides of the front buffer 242 and the rear buffer 244, respectively.

The front buffer robot 246 transfers the substrate between the front buffers 242. More specifically, the front buffer robot 246 transfers the substrate between the front buffers 242 arranged to be stacked while moving along the third direction 6. In addition, the rear buffer robot 248 transfers the substrate between the rear buffers 244 arranged to be stacked while moving along the third direction 6.

The heat treating chamber 300 performs a heat treatment process to adjust a temperature of the substrate. The heat treatment process according to an embodiment may include a cooling process of lowering a temperature of the substrate and a heating process of increasing the temperature of the substrate. A plurality of heat treating chambers 300 may be provided. The heat treating chambers 300 are disposed along the first direction 2. In addition, the heat treating chambers 300 are arranged to be stacked in the third direction 6. The heat treating chambers 300 are positioned on a side of the transfer chamber 220.

The liquid treating chamber 400 performs a liquid treatment process of supplying a liquid on the substrate. A plurality of liquid treating chambers 400 may be provided. The liquid treating chambers 400 are disposed along the first direction 2. In addition, the liquid treating chambers 400 are arranged to be stacked in the third direction 6. The liquid treating chambers 400 are positioned on the other side of the transfer chamber 200. That is, the heat treating chamber 300 and the liquid treating chamber 400 are disposed to face each other based on the transfer chamber 220.

Figure 5:
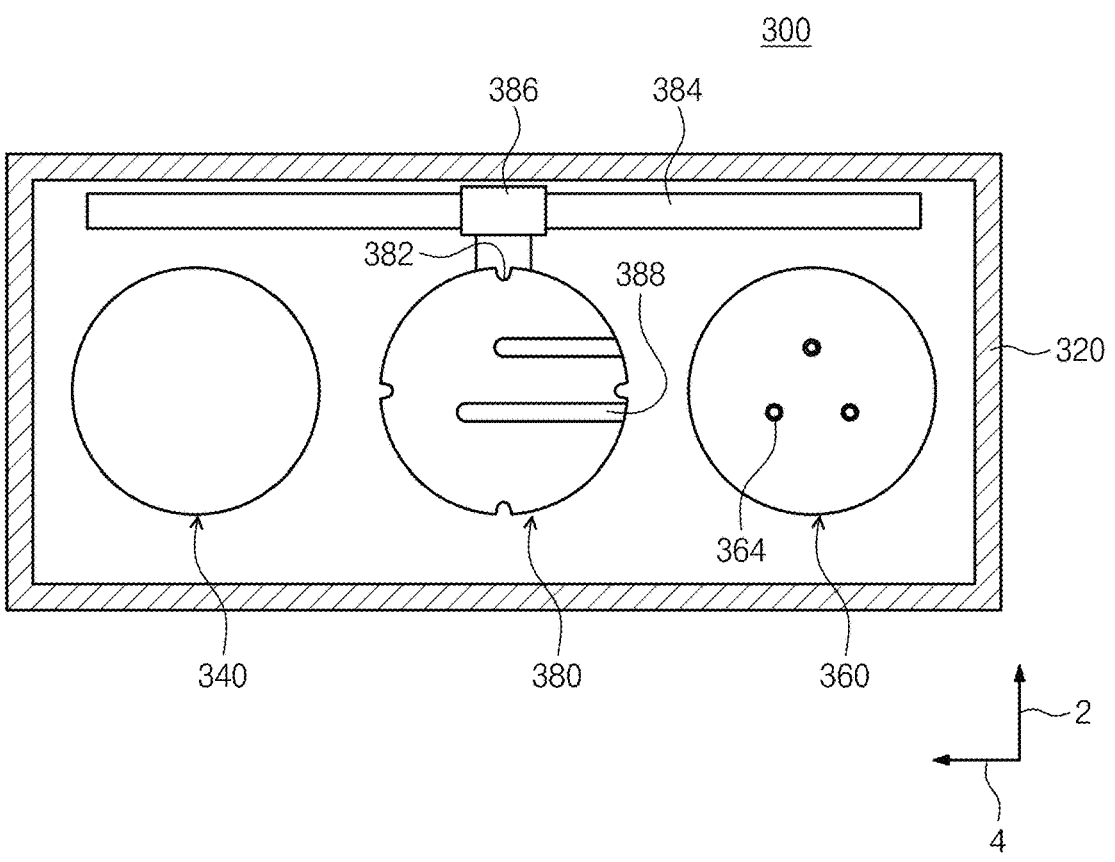
FIG. 5 is a plan view schematically illustrating a heat treating chamber according to an embodiment.
Figure 6:
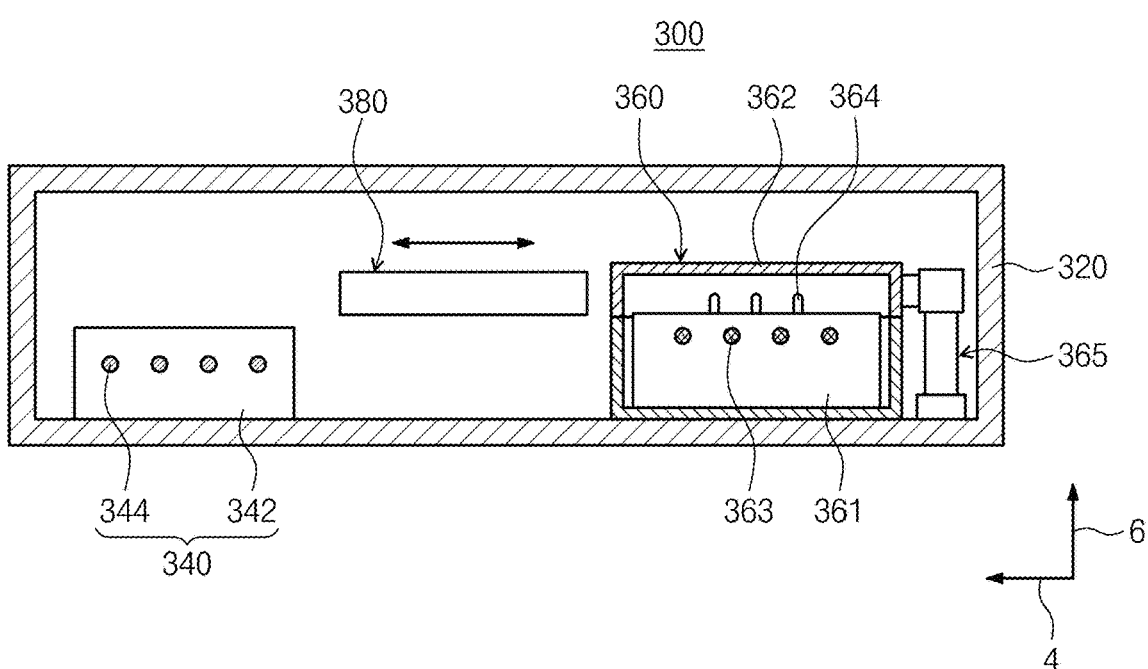
FIG. 6 is a front view schematically illustrating the heat treating chamber according to an embodiment.

FIG. 5 is a plan view schematically illustrating a heat treating chamber according to an embodiment. FIG. 6 is a front view schematically illustrating a heat treating chamber according to an embodiment.

The heat treating chamber 300 includes a housing 320, a cooling unit 340, a heating unit 360, and a transfer plate 380.

The housing 320 has a generally rectangular parallelepiped shape. Also, the housing 320 has an inner space. An entrance (not shown) through which the substrate enters and exits is formed on the sidewall of the housing 320. A cooling unit 340, a heating unit 360, and a transfer plate 380 are positioned in an inner space of the housing 320. The cooling unit 340 and the heating unit 360 are positioned side by side in the second direction 4.

According to an embodiment, the cooling unit 340 may be positioned closer to the transfer chamber 220 than the heating unit 360. The cooling unit 340 includes a cooling plate 342 and a cooling fluid channel 344. The cooling plate 342 may have a substantially circular shape when viewed from above. The cooling fluid channel 344 is positioned inside the cooling plate 342. A cooling fluid may flow through the cooling fluid channel 344. The cooling fluid may flow within the cooling fluid channel 344 to lower a temperature of the cooling plate 342.

The heating unit 360 may include a heating plate 361, a cover 362, and a heater 363.

The heating plate 361 may have a circular shape when viewed from above. The heating plate 361 may have a diameter larger than that of the substrate. A heater 363 is disposed inside the heating plate 361. The heater 363 may be any one of known heating element which generate a heat by resisting a current.

A plurality of lifting/lowering pins 364 moving up and down along the third direction 6 are disposed on the heating plate 361. The lifting/lowering pins 364 may receive the substrate from a transfer means (e.g., transfer plate 380) outside the heating unit 360, and transfer the substrate to the heating plate 361. In addition, the lifting/lowering pins 364 may lift the substrate from the heating plate 361 and transfer the substrate to a transfer means outside the heating unit 360.

The cover 362 has a shape in which a bottom portion is opened. The cover 362 is positioned above the heating plate 361 and can be moved in the vertical direction by the driver

365 coupled to the cover 362. The driver 365 may be any one of known motors which transfer a driving force. If the cover 362 is downwardly moved by the driver 365, a closed space may be formed by combining the cover 362 and the heating plate 361. The space which is formed by a combination of the cover 362 and the heating plate 361 may function as a heating space for heating the substrate.

The transfer plate 380 generally has a disk shape. In addition, the transfer plate 380 may have a diameter corresponding to the substrate. A notch 382 is formed at an edge of the transfer plate 380. In addition, a plate driver 386 may be coupled to the transfer plate 380. The plate driver 386 is mounted on the rail 384 having a lengthwise direction horizontal to the second direction 4. Accordingly, the transfer plate 380 may be linearly moved along the rail 384 by the plate driver 386.

In addition, a plurality of slit-shaped guide grooves 388 are formed in the transfer plate 380. The guide groove 388 extends from an end of the transfer plate 380 to an inside of the transfer plate 380. The guide groove 388 has a lengthwise direction horizontal to the second direction 4, and the plurality of guide grooves 388 are formed to be spaced apart along the first direction 2. If the substrate is taken over and handed over between the transfer plate 380 and the heating unit 360, the transfer plate 380 and the pin 364 can be prevented from interfering with each other by the guide groove 388 formed in the transfer plate 380.

The transfer plate 380 transfers the substrate to the pin 364, and the pin 364 downwardly moves to mount the substrate on the heating plate 361. A temperature of the substrate mounted on the heating plate 361 may be increased by a heat generation of the heater 363. In addition, the transfer plate 380 may be in contact with the cooling plate 342. More specifically, if the substrate is placed on a top side of the transfer plate 380, the transfer plate 380 may contact the cooling plate 342. The temperature of the substrate mounted on the transfer plate 380 may be lowered by a cooling fluid flowing through the cooling fluid channel 344.

In addition, according to an embodiment, the heating unit 360 provided in some of the plurality of heat treating chambers 300 may improve an adhesion rate of the photoresist liquid to the substrate by supplying a gas while heating the substrate. According to an embodiment, the gas may be a hexamethyldisilane.

Figure 7:
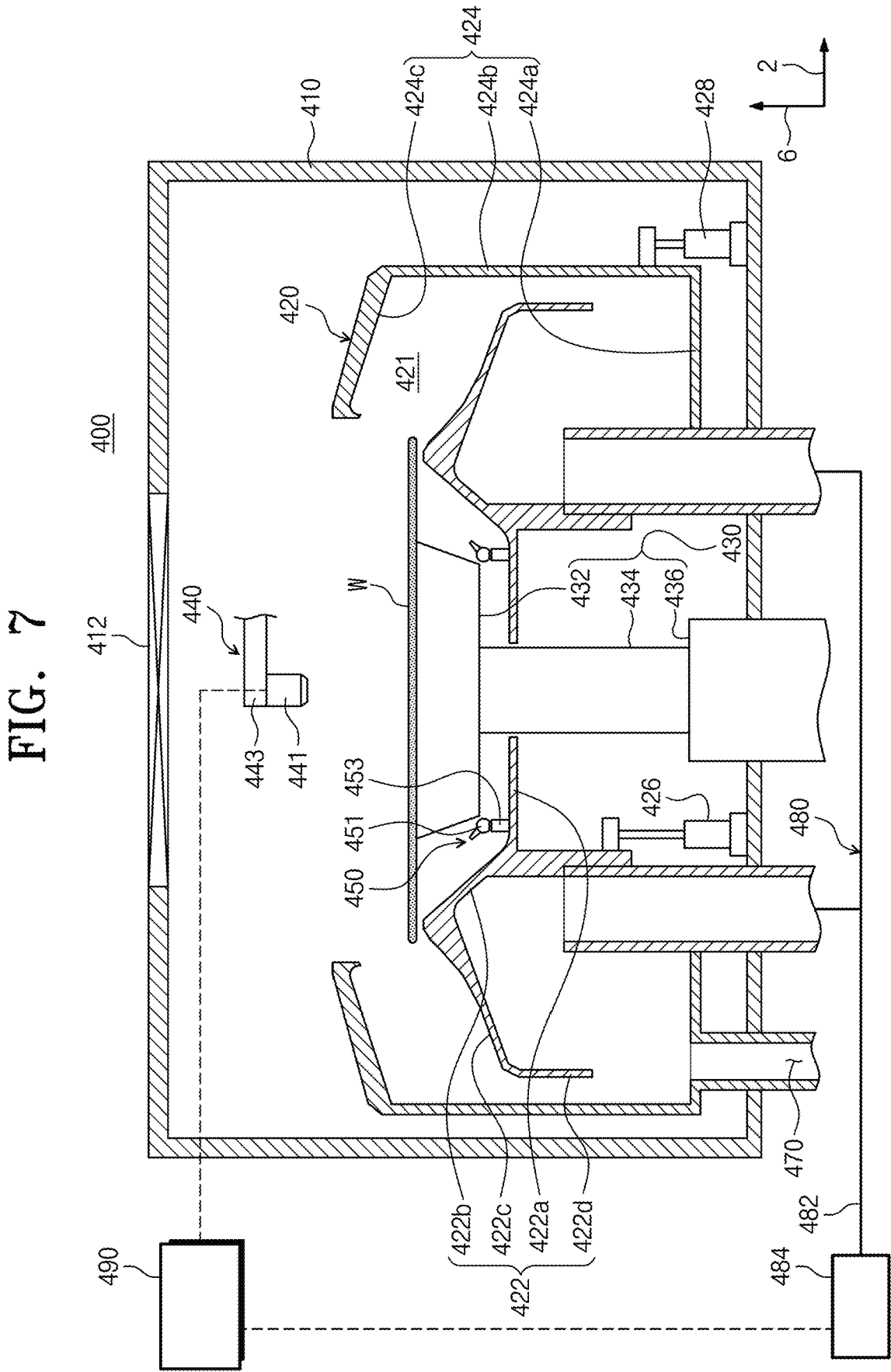
FIG. 7 is a cross-sectional view schematically illustrating a liquid treating chamber according to an embodiment.

FIG. 7 is a cross-sectional view schematically illustrating a liquid treating chamber according to an embodiment.

The liquid treating chamber 400 may include a housing 410, a treating container 420, a support unit 430, a first liquid supply unit 440, a second liquid supply unit 450, an exhaust unit 480, and a controller 490.

The housing 410 may have a substantially rectangular parallelepiped shape. In addition, the housing 410 may have an inner space. The treating container 420, the support unit 430, the first liquid supply unit 440 and the second liquid supply unit 450 are disposed in the inner space of the housing 410. In addition, an entrance (not shown) is formed on a sidewall of the housing 410. The entrance (not shown) functions as a space in which the substrate W is taken in and out of the inner space of the housing 410. In addition, a fan filter unit 412 is installed on a top wall of the housing 410.

The fan filter unit 412 forms an airflow within the inner space of the housing 410. More specifically, the fan filter unit 412 forms a downward airflow in the inner space of the housing 410. The fan filter unit 412 according to an embodiment may include a fan and a filter. The fan according to an embodiment may be any one of known fans capable of forming an airflow. In addition, the fan according to an embodiment may be a fan capable of adjusting an intensity of the airflow by adjusting an output. The airflow formed by the fan filter unit 412 may be exhausted to the outside of the housing 410 by the exhaust unit 480 to be described later.

The treating container 420 has a bowl shape with an open top portion. The treating container 420 surrounds the substrate W supported by the support unit 430 to be described later. An inside of the treating container 420 functions as a treating space 421 in which the substrate W is treated. The treating space 421 functions as a space in which the support unit 430 supports and rotates the substrate W. In addition, the treating space 421 functions as a space in which the first liquid supply unit 440 and the second liquid supply unit 450 to be described later supply the liquid to the substrate W to treat the substrate W.

The treating container 420 may include an inner cup 422 and an outer cup 424.

The inner cup 422 is positioned inside the outer cup 424. In addition, the inner cup 422 may surround a chuck 432 to be described later. The inner cup 422 may have a first portion 422a, a second portion 422b, a third portion 422c, and a fourth portion 422d. The first portion 422a, the second portion 422b, the third portion 422c, and the fourth portion 422d can be made of the same or similar material, and can be integrally formed.

The first portion 422a may have a disk shape surrounding a rotation shaft 434 to be described later. The first portion 422a may be formed in a direction parallel to the substrate W supported by the support unit 430. In addition, the first portion 422a may share a center with a chuck 432 to be described later. The second liquid supply unit 450 to be described later may be disposed in the first portion 422a.

The second portion 422b outwardly extends from the first portion 422a. In addition, the third portion 422c outwardly extends from the second portion 422b. The second portion 422b and the third portion 422c may be formed to be inclined, respectively. For example, top surfaces of the second portion 422b and the third portion 422c may have different angles with respect to a virtual horizontal line. According to an embodiment, the top surface of the second portion 422b may be upwardly inclined as it moves away from the rotation shaft 434 to be described later. In addition, the top surface of the third portion 422c may be downwardly inclined as it moves away from the rotation shaft 434. In addition, a point at which the second portion 422b and the third portion 422c meet may be formed to be rounded. In addition, the point at which the second portion 422b and the third portion 422c meet may overlap a side end of the substrate W supported by the chuck 432 in the vertical direction.

The fourth portion 422d extends from the third portion 422c. According to an embodiment, the fourth portion 422d downwardly extends from the third portion 422c. In addition, the fourth portion 422d may be spaced apart from the side portion 424b to be described later by a predetermined distance. A space between the fourth portion 422d and the side portion 424d may function as a path through which a liquid supplied to the substrate W is recollected. In addition, a space between the fourth portion 422d and the side portion 424d may function as a path through which an atmosphere of the treating space 421 is exhausted.

The outer cup 424 may have a shape surrounding the inner cup 422. The outer cup 424 has a bottom portion 424a, a side portion 424b, and an inclined portion 424c. The bottom portion 424a may be formed in a disk shape having a hollow. A recollecting line 470 is connected to the bottom portion 424a. The recollecting line 470 recollects a liquid supplied on the substrate W. The liquid recollected by the recollecting line 470 may be reused by an outer regeneration system (not shown).

The side portion 424b and the inclined portion 424c may have a substantially ring shape. The side portion 424b upwardly extends from an end of the bottom portion 424a. The inclined portion 424c extends from the top end of the side portion 424b. For example, the inclined part 424c may extend from the top end of the side portion 424b toward a central axis of the rotation shaft 434 to be described later. In addition, the inclined portion 424c may be upwardly inclined with respect to the ground toward the central axis of the rotation shaft 434.

An inner lifting/lowering unit 426 is coupled to the inner cup 422. In addition, an outer lifting/lowering unit 428 is coupled to the outer cup 424. The inner lifting/lowering unit 426 may lift/lower the inner cup 422. In addition, the outer lifting/lowering unit 428 may lift/lower the outer cup 424. The inner lifting/lowering unit 426 and the outer lifting/lowering unit 428 may be any one of known motors which transmit a driving force, respectively. According to an embodiment, while treating the substrate W, the outer lifting/lowering unit 428 may upwardly move the outer cup 424. Accordingly, a top end of the inclined part 424c may be positioned higher than a top surface of the substrate W supported by the support unit 430 while treating the substrate W. On the contrary, after the treating of the substrate W is completed, the outer lifting/lowering unit 428 may downwardly move the outer cup 424 so that the top end of the inclined part 424c is positioned lower than the top surface of the substrate W supported by the support unit 430.

The support unit 430 supports and rotates the substrate W. The support unit 430 may include a chuck 432, a rotation shaft 434, and a rotation driver 436.

The substrate W is seated on a top surface of the chuck 432. If viewed from above, the top surface of the chuck 432 has a substantially circular shape. In addition, the top surface of the chuck 432 may have a diameter smaller than that of the substrate W. The rotation shaft 434 is coupled to a bottom end of the chuck 432. The rotation shaft 434 has a lengthwise direction parallel to the third direction 6. The rotation shaft 434 may rotate by receiving a power from the rotation driver 436. According to an embodiment, the rotation driver 436 may be a rotation motor capable of transmitting a rotational force to the rotation shaft 434. In addition, the rotation driver 436 may be a rotation motor capable of varying a rotation speed of the rotation shaft 434. As the rotation shaft 434 is rotated by the rotation driver 436, the substrate W may also rotate with the axial direction of the rotation shaft 434 as the center axis.

The first liquid supply unit 440 supplies a first liquid to the substrate W supported by the support unit 430. More specifically, the first liquid supply unit 440 supplies the first liquid to the top surface of the substrate W among the top surface and the bottom surface of the substrate W. The patterns are formed on the top surface of the substrate W according to an embodiment. That is, the first liquid is supplied to the top surface of the substrate W on which the pattern is formed. The first liquid according to an embodiment may be a liquid which is sensitive to a specific light having a specific wavelength. For example, the first liquid may be a photosensitive liquid such as a photoresist (PR).

The first liquid supply unit 440 may include a first liquid nozzle 441. The first liquid nozzle 441 supplies the first liquid to the top surface of the substrate W supported by the chuck 432. More specifically, the first liquid nozzle 441 supplies the first liquid to a central region of a rotating substrate W. The first liquid nozzle 441 is supported by the nozzle arm 443. The first liquid nozzle 441 is installed at an end of the nozzle arm 443. The nozzle arm 443 may be coupled to a nozzle driver not shown and its position may be changed. For example, the nozzle driver (not shown) may rotate the nozzle arm 443 on a horizontal plane. In addition, the nozzle driver (not shown) may lift/lower the nozzle arm 443 in the third direction 6. However, the inventive concept is not limited thereto, and the nozzle driver (not shown) may move the nozzle arm 443 along a guide rail installed on a horizontal plane. In this case, a position of the nozzle arm 443 may be changed by forwardly and backwardly moving in the first direction 2 or the second direction 4.

As the position of the nozzle arm 443 is changed, a position of the first liquid nozzle 441 is also changed, so that a position to which the liquid is supplied to the substrate W may be changed. For example, if the first liquid nozzle 441 supplies the first liquid to the substrate W, the position of the first liquid nozzle 441 may be changed so that the central region of the first liquid nozzle 441 and the substrate W overlaps when viewed from above.

Unlike the above-described example, the number of nozzles supplying the liquid to the substrate W may be variously changed. For example, the number of nozzles may be at least N or more (N is a natural number of 2 or more). Each of the nozzles may supply different liquids including a photoresist liquid to the substrate W. For example, some nozzles may supply a photoresist liquid with a different composition ratio to the substrate W, and some other nozzles may supply a different kind of liquid from the photoresist liquid to the substrate W. For example, in some other nozzles, a liquid which a surface property of the substrate W or increases an adhesive force between the substrate W and the photoresist liquid may be supplied to the substrate W.

The second liquid supply unit 450 supplies a second liquid to the substrate W supported by the support unit 430. More specifically, the second liquid supply unit 450 supplies the second liquid to the bottom surface of the substrate W among the top surface and the bottom surface of the substrate W. That is, the second liquid is supplied to the bottom surface of the substrate W on which a pattern is not formed. According to an embodiment, the second liquid may be a liquid which cleans the substrate W by removing the first liquid supplied on the substrate W from the substrate W. Accordingly, the second liquid may be referred to as a cleaning liquid. For example, the second liquid may be thinner.

The second liquid supply unit 450 may include a second liquid nozzle 451. The second liquid nozzle 451 supplies the second liquid to the bottom surface of the substrate W supported by the chuck 432. More specifically, the second liquid nozzle 451 supplies the second liquid to an edge region of the rotating substrate W. In addition, the second liquid nozzle 451 may be rotatably provided. The second liquid nozzle 451 is coupled to the fixing body 453. The fixing body 453 may be fixedly installed in the inner cup 422 described above. More specifically, the fixing body 453 may be fixedly installed at a top end of the first portion 422a.

The exhaust unit 480 may be coupled to the treating container 420. The exhaust unit 480 exhausts an atmosphere of the treating space 421. More specifically, the exhaust unit 480 exhausts the atmosphere of the treating space 421 by applying a negative pressure to the treating space 421. That is, the exhaust unit 480 changes an exhaust pressure of the treating space 421.

The exhaust unit 480 may include an exhaust line 482. The atmosphere of the treating space 421 may be exhausted through the exhaust line 482. The exhaust line 482 may be coupled to the outer cup 424. More specifically, an end of the exhaust line 482 is coupled to the bottom portion 424a, and an other end thereof extends to the outside of the liquid treating chamber 400. In addition, the exhaust line 482 is disposed to overlap the inner cup 422 when viewed from above. In addition, a depressurizing pump 484 is installed in the exhaust line 482. The depressurizing pump 484 may apply the negative pressure to the treating space 421 through the exhaust line 482. The depressurizing pump 484 may change an intensity of the negative pressure applied to the treating space 421.

The controller 490 may control the first liquid nozzle 441, the second liquid nozzle 451, and the exhaust unit 480. The controller 490 may comprise a process controller consisting of a microprocessor (computer) that executes a control of the first liquid nozzle 441, the second liquid nozzle 451, and the exhaust unit 480, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory. A specific mechanism by which the controller 490 controls the first liquid nozzle 441, the second liquid nozzle 451, and the exhaust unit 480 to treat the substrate W will be described later.

Referring back to FIG. 2 to FIG. 4, the interface module 50 connects the treating module 20 to an outer exposure apparatus 90. The interface module 50 includes an interface frame 510, an interface buffer 530, a transfer unit 550, and an additional process chamber 570.

The interface buffer 530, the transfer unit 550, and the additional process chamber 570 are positioned inside the interface frame 510. The interface buffer 530 provides a space in which the substrate is temporarily stored in a process of transferring the substrate between the coating block 20a, the additional process chamber 570, the exposure apparatus 90, and the developing block 20b. A plurality of interface buffers 530 may be provided, and the plurality of interface buffers 530 may be disposed to be stacked on each other.

The transfer unit 550 transfers the substrate between the coating block 20a, the additional process chamber 570, the exposure apparatus 90 or the developing block 20b. The transfer unit 550 includes at least one robot. According to an embodiment, the transfer unit 550 may include a first robot 552, a second robot 554, and a third robot (not shown).

The first robot 552 may transfer the substrate between the coating block 20a, the additional process chamber 570, and the exposure apparatus 90. More specifically, the first robot 552 may transfer the substrate between the rear buffer 244, the additional process chamber 570, and the exposure apparatus 90. In addition, the second robot 554 may transfer the substrate between the interface buffer 530 and the exposure apparatus 90. The third robot, which is not shown, may transfer the substrate between the interface buffer 530 and the developing block 20b. Each of the first robot 552, the second robot 554, and the third robot (not shown) may include a hand on which a substrate is placed. Each hand forwardly and backwardly move, rotate around an axis parallel to the third direction 6, and vertically move along the third direction 6.

The additional process chamber 570 may perform a predetermined additional process before the substrate which has completed a predetermined process at the coating block 20*a* is taken into the exposure apparatus 90. In addition, the additional process chamber 570 may perform a predetermined additional process before the substrate that has been treated by the exposure apparatus 90 is taken into the developing block 20*b*.

A plurality of additional process chambers 570 may be provided. In addition, the plurality of additional process chambers 570 may be disposed to be stacked on each other. All of the additional process chambers 570 may perform the same process. Selectively, the additional process chambers 570 may perform different processes. For example, in some of the plurality of additional process chambers 570, an additional process according to an embodiment be performing an edge exposure process of exposing an edge region of the substrate. In addition, in other parts of the plurality of additional process chambers 570, a top surface cleaning process of cleaning a top surface of the substrate may be performed. In addition, in another part of the plurality of additional process chambers 570, a bottom surface cleaning process of cleaning a bottom surface of the substrate may be performed.

Hereinafter, a substrate treating method according to an embodiment will be described. The substrate treating method described below may be performed by the substrate treatment apparatus described with reference to FIG. 2 to FIG. 7. Accordingly, hereinafter, the substrate treating method according to an embodiment will be described by citing the reference numerals shown in FIG. 2 to FIG. 7. In addition, the substrate treating method described below can be performed by controlling the first liquid nozzle 441, the second liquid nozzle 451, and the exhaust unit 480 described above by the controller 490.

Figure 8:
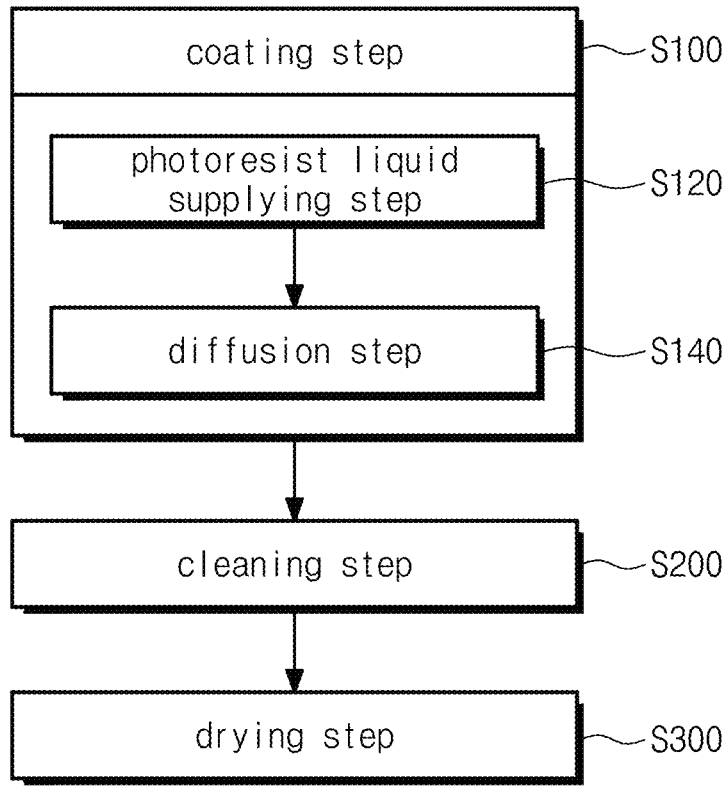
FIG. 8 is a flowchart of a substrate treating method according to an embodiment.
Figure 9:
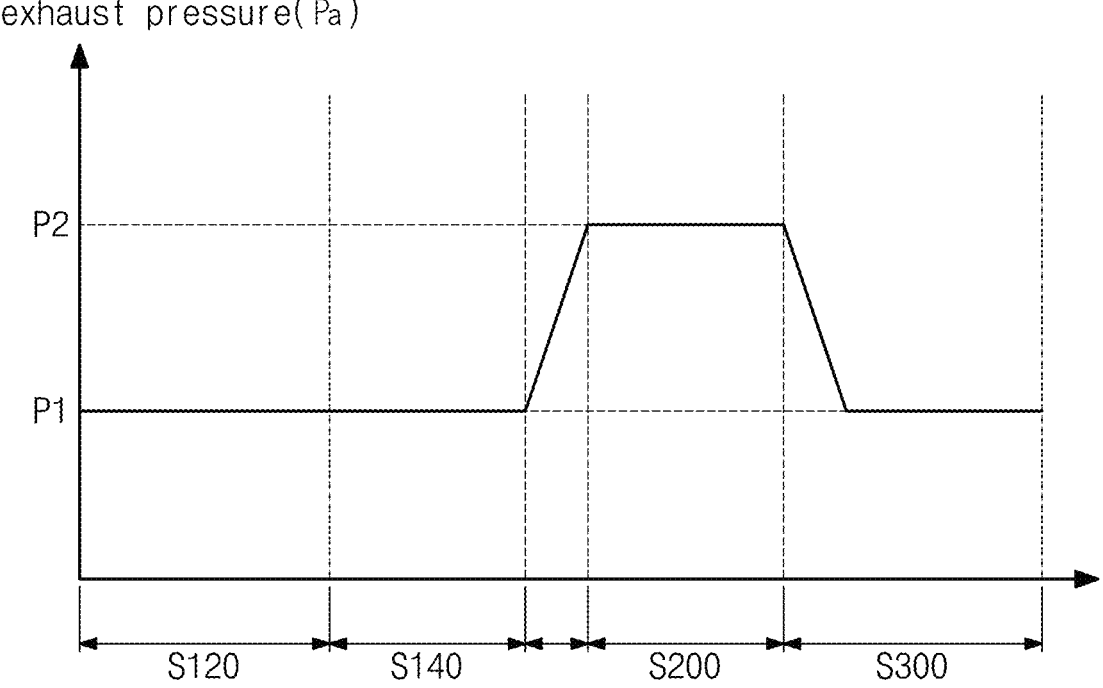
FIG. 9 is a graph illustrating a change in an exhaust pressure of a treating space in each step of the substrate treating method according to an embodiment.
Figure 10:
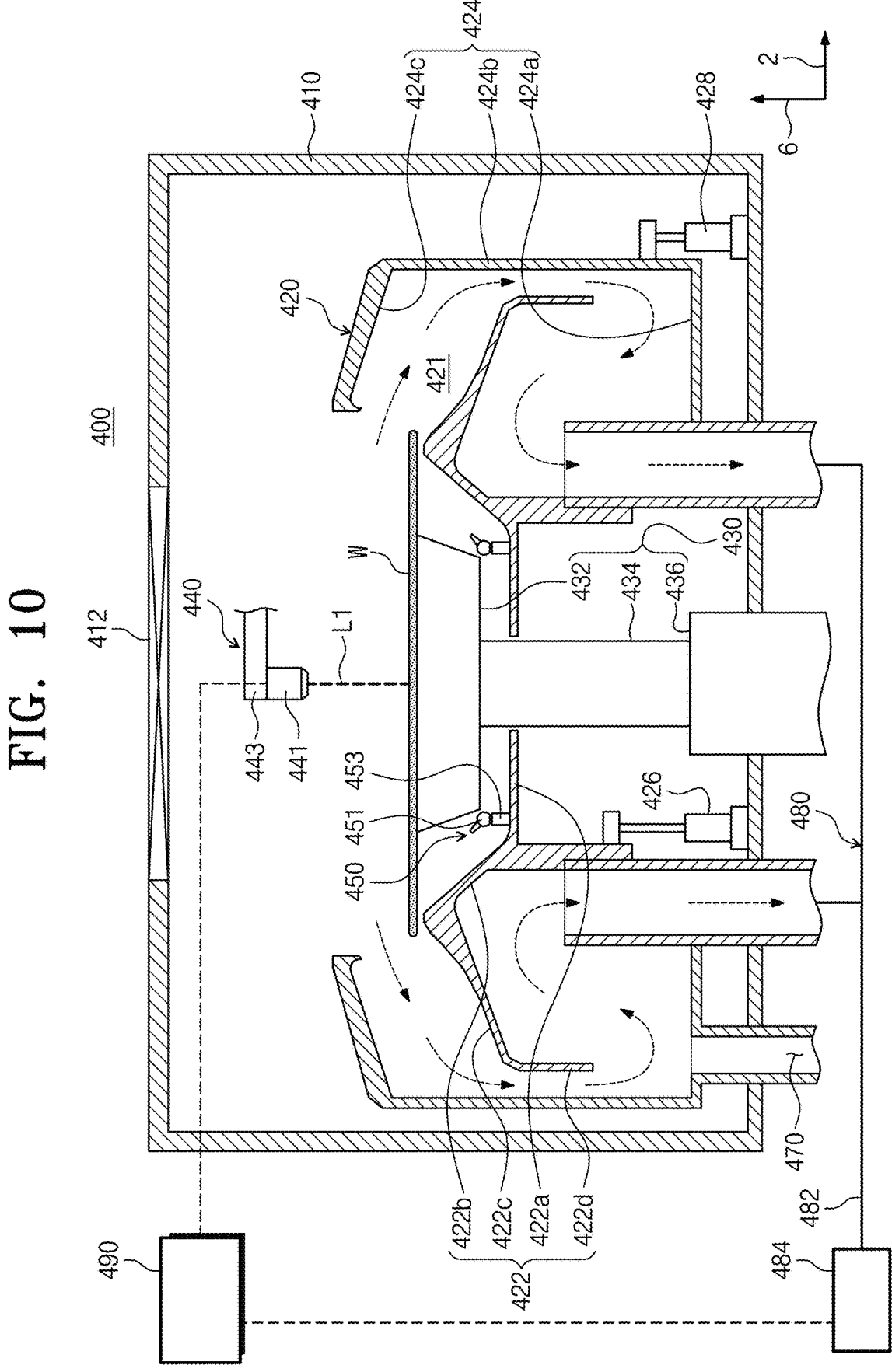
FIG. 10 is an enlarged view schematically illustrating a state in which a substrate is treated in a photoresist liquid supply step according to an embodiment.
Figure 11:
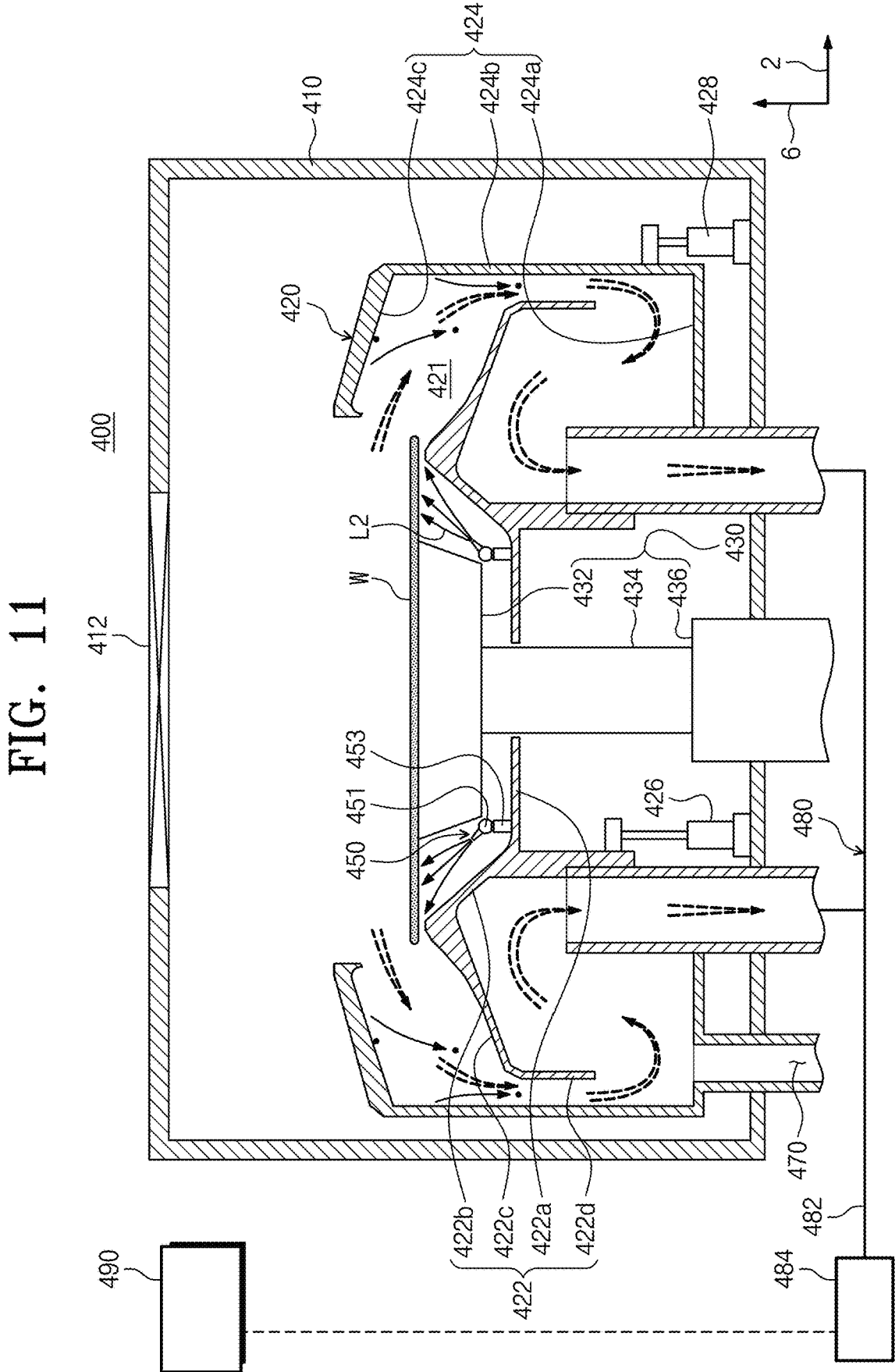
FIG. 11 is an enlarged view schematically illustrating a state in which the substrate is treated in a cleaning step according to an embodiment.
Figure 12:
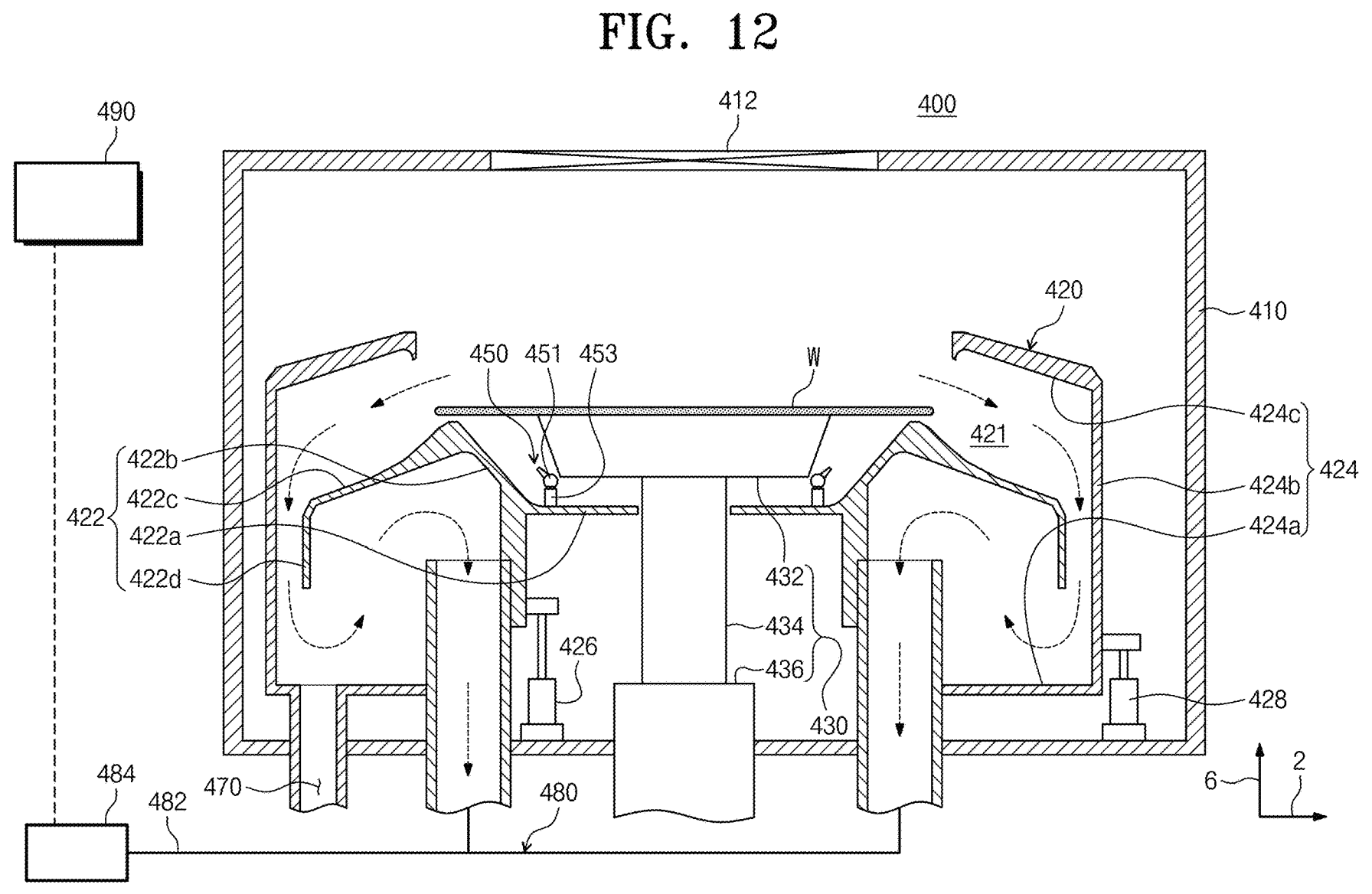

FIG. 8 is a flowchart of the substrate treating method according to an embodiment. FIG. 9 is a graph illustrating a change in an exhaust pressure of a treating space in each step of the substrate treating method according to an embodiment. FIG. 10 is an enlarged view schematically illustrating a state in which a substrate is treated in a photoresist liquid supply step according to an embodiment. FIG. 11 is an enlarged view schematically illustrating a state in which the substrate is treated in a cleaning step according to an embodiment. FIG. 12 is an enlarged view schematically illustrating a state in which a substrate is treated in a drying step according to an embodiment.

The substrate treating method according to an embodiment may include a coating step S100, a cleaning step S200, and a drying step S300.

The coating step S100, the cleaning step S200, and the drying step S300 according to an embodiment may be performed in the order of time series. In addition, before performing the coating step S100, a liquid may be supplied to the substrate W to pre-treat the substrate W. The liquid for pre-treating the substrate W may be a liquid for hydrophobizing the substrate W.

As shown in FIG. 10, in the coating step S100, the first liquid L1 is supplied to the rotating substrate W and the first liquid L1 is coated on the substrate W. The coating step S100 may include a photoresist liquid supplying step S120 and a diffusion step S140.

In the photoresist liquid supplying step S120, the first liquid L1 is supplied to the rotating substrate W. In the photoresist liquid supplying step S120 according to an embodiment, the first liquid L1 is supplied to the top surface of the substrate W and the central region of the substrate W. In addition, while performing the photoresist liquid supply step S120 according to an embodiment, the exhaust unit 480 exhausts the atmosphere of the treating space 421. According to an embodiment, the exhaust pressure of the treating space 421 in the photoresist liquid supply step S120 may be maintained at a first pressure P1. For example, the first pressure may be 70 Pa. However, the scope of the inventive concept is not limited to the above-described figures. In the photoresist liquid supply step S120, the exhaust pressure acts in a direction toward the bottom side of the substrate W. Accordingly, as shown in FIG. 10, the atmosphere of the treating space 421 is exhausted to the outside of the liquid treating chamber 400 through the exhaust line 482.

In the diffusion step S140, the substrate W is rotated to diffuse the first liquid L1 supplied onto the substrate W. More specifically, in the previous step of supplying the photoresist liquid S120, the first liquid L1 supplied to the central region of the substrate W diffuses to the edge region of the substrate W by a centrifugal force of the rotating substrate W. Accordingly, the first liquid L1 may be uniformly applied to an entire region of the top surface of the substrate W.

In addition, while performing the diffusion step S140, the exhaust unit 480 may continuously exhaust the atmosphere of the treating space 421. The exhaust pressure of the treating space 421 in the diffusion step S140 according to an embodiment may be maintained at approximately 70 Pa.

As the substrate W is rotated in the coating step S100, the first liquid L1 supplied to the substrate W may be scattered to an outside of the substrate W. The first liquid L1 scattered to the outside of the substrate W may be attached to the treating container 420. In addition, particles of the first liquid L1 scattered outside the substrate W may float in the atmosphere of the treating space 421. Accordingly, by exhausting the atmosphere of the treating space 421 in the photoresist liquid supply step S120 and the diffusion step S140, scattered particles of the first liquid L1 and the first liquid L1 may be removed from the treating space 421.

As shown in FIG. 11, in the cleaning step S200, the second liquid L2 is supplied to the rotating substrate W. More specifically, in the cleaning step S200, the second liquid L2 is supplied to the bottom surface of the rotating substrate W. In addition, in the cleaning step S200, the second liquid L2 is supplied to the edge region of the rotating substrate W. The second liquid L2 may remove the first liquid L1 remaining on the bottom surface of the edge region of the substrate W. That is, the first liquid L1 flowing to the bottom surface of the edge region of the substrate W by rotation of the substrate W in the coating step S100 may be removed by the second liquid L2 supplied in the cleaning step S200.

In addition, while performing the cleaning step S200 according to an embodiment, the exhaust unit 480 exhausts the atmosphere of the treating space 421. In a section from the coating step S100 to the cleaning step S200 according to an embodiment, the exhaust pressure of the treating space 421 may be changed. For example, after the coating step S100 is performed and before the cleaning step S200 is performed, the exhaust pressure of the treating space 421 may gradually increase. For example, the exhaust pressure of the treating space 421 may increase to a second pressure P2. According to an embodiment, during the cleaning step S200, the exhaust pressure of the treating space 421 may be maintained at the second pressure P2. The second pressure P2 may be a pressure higher than the above-described first pressure P1. For example, the second pressure P2 may be 90 Pa. The above-described value of the second pressure P2 is provided for convenience of understanding, and the scope of the inventive concept is not limited to the above-described value.

As described above, the exhaust pressure is applied in a direction toward a bottom side of the substrate W. Accordingly, as shown in FIG. 11, the atmosphere of the treating space 421 is exhausted to the outside of the liquid treating chamber 400 through the exhaust line 482. The atmosphere of the treating space 421 is strongly exhausted by the exhaust pressure of the treating space 421 by the exhaust unit 480. That is, in the cleaning step S200, the atmosphere of the treating space 421 is exhausted stronger than that of the above-described photoresist liquid supply step S120 and diffusion step S140.

In the process of performing the cleaning step S200, some of the second liquid L2 scattered by colliding with the substrate W are attached to an inner wall of the treating container 420, particularly to an inner wall of the outer cup 424. In addition, in the cleaning step S200, a portion of the first liquid L1 remaining on the bottom surface of the substrate W is removed from the substrate W during the collision between the second liquid L2 and the substrate W. Some of the first liquid L1 removed from the substrate W is attached again to the inner wall of the outer cup 424.

While performing the cleaning step S200, some of the first liquid L1 and the second liquid L2 attached to the inner wall of the outer cup 424 may rebound to the substrate W. In addition, some of the first liquid L1 and second liquid L2 attached to the inner wall of the outer cup 424 can be solidified and grow into a particle source which contaminates subsequent substrates. That is, the first liquid L1 and the second liquid L2 attached to the inner wall of the outer cup 424 may be potential particle sources.

In addition, in the cleaning step S200, the second liquid L2 is supplied to the edge region of the substrate W. In contrast, in the above-described photoresist liquid supply step S120, the first liquid L1 is supplied to the central region of the substrate W, and in the above-described diffusion step S140, the substrate W is rotated while a supplying of the liquid is stopped. That is, in the cleaning step S200, a relatively larger amount of liquid is scattered outside the substrate W than in the photoresist liquid supply step S120 and the diffusion step S140.

Accordingly, according to an embodiment of the inventive concept, since the exhaust pressure of the treating space 421 in the cleaning step S200 is greater than the exhaust pressure of the treating space 421 in the coating step S100, a scattering of liquid which may become a source of particles may be efficiently suppressed. As a result, it is possible to minimize an adhesion of liquid to the inner wall of the treating container 420. Accordingly, it is possible to minimize the liquid from rebounding back to the substrate W currently being treated, and furthermore, it is possible to minimize a liquid attached to the inner wall of the treatment container 420 from contaminating the substrate W again.

In addition, according to the above-described example, the exhaust pressure of the treating space 421 is preemptively increased in a section just before the cleaning step S200, so that the second liquid L2 can be supplied to the edge region of the substrate W while the exhaust pressure of the treating space 421 is increased. Accordingly, it is possible to more efficiently suppress a scattering of the second liquid L2 which has collided with the substrate W, and to more efficiently suppress a scattering of some of the second liquid L2 attached to the inner wall of the treating container 420.

As shown in FIG. 12, in the drying step S300, the second liquid remaining on the substrate W is removed by rotating the substrate W. A rotation speed of the substrate W in the drying step S300 may be relatively faster than a rotation speed of the substrate W in the coating step S100 and the cleaning step S200 described above. In addition, during the drying step S300, the exhaust unit 480 continuously exhausts the atmosphere of the treating space 421. According to an embodiment, in the drying step S300, the exhaust pressure of the treating space 421 may be gradually decreased and maintained at approximately 70 Pa. That is, the exhaust pressure of the treating space 421 may be primarily changed in a section from the diffusion step S140 to the cleaning step S200, and the exhaust pressure of the treating space 421 may be secondarily changed in the section from the cleaning step S200 to the drying step S300.

Unlike the above-described example, the exhaust pressure of the treating space 421 may gradually increase during the diffusion step S140. For example, the exhaust pressure of the treating space 421 may gradually increase during the diffusion step S140 immediately before performing the cleaning step S200.

Hereinafter, the substrate treating method according to another embodiment of the inventive concept will be described. The substrate treating method according to an embodiment to be described below is mostly performed using the same or similar mechanism as the substrate treating method according to an embodiment described with reference to FIG. 8 to FIG. 12.

Accordingly, in addition to the case of additional description, a description of overlapping content will be omitted.

FIG. 13 is a graph illustrating a change in the exhaust pressure of the treating space in each step of the substrate treating method according to another embodiment.

The exhaust pressure of the treating space 421 according to an embodiment may be changed if performing the cleaning step S200. More specifically, in the cleaning step S200, the exhaust unit 480 may gradually increase the exhaust pressure of the treating space 421 while supplying the second liquid to the edge region of the substrate W.

In addition, according to another embodiment, while performing the cleaning step S200, the fan filter unit 412 may form a downward airflow in the treating space 421. The atmosphere of the treating space 421 may be strongly exhausted by the downward airflow formed in the treating space 421 by the fan filter unit 412 and the exhaust pressure of the treating space 421 by the exhaust unit 480. That is, since the atmosphere of the treating space 421 is exhausted in the cleaning step S200 more than in the photoresist liquid supplying step S120 and the diffusion step S140, a contamination of the substrate W by the second liquid supplied to the substrate W can be more efficiently suppressed in the cleaning step S200.

In addition, unlike the above-described example, the fan filter unit 412 may form a downward airflow in the treating space 421 in an entire section including the coating step S100, the cleaning step S200, and the drying step S300. In this case, a strength of the downward airflow formed in the treating space 421 in the cleaning step S200 may be stronger than a strength of the downward airflow formed in the treating space 421 in the remaining sections.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a support configured to support and rotate a substrate;
a treating container surrounding the substrate and supported on the support, the treating container being configured to provide a treating space for treating the substrate within;
an exhaust configured to combine with the treating space to exhaust an atmosphere of the treating space;
a first liquid nozzle configured to supply a first liquid to the substrate on the support;
a second liquid nozzle configured to supply a second liquid to the substrate on the support, the second liquid being different from the first liquid; and
a controller configured to control the first liquid nozzle, the second liquid nozzle, and the exhaust so that the first liquid is supplied to a first central region of a top surface of the substrate as the substrate rotates, followed by the second liquid being supplied to an edge region of a bottom surface of the substrate as the substrate rotates, with an exhausting pressure of the treating space during the supplying of the first liquid being different from an exhausting pressure of the treating space during the supplying of the second liquid.

2. The substrate treating apparatus of claim 1, wherein the controller is further configured to control the exhaust so that the exhausting pressure of the treating space during the supplying of the second liquid is greater than the exhausting pressure of the treating space during the supplying of the first liquid.

3. The substrate treating apparatus of claim 2, wherein the controller is further configured to control the exhaust so that the exhaust pressure of the treating space is preemptively increased after the supplying of the first liquid and before the supplying of the second liquid.

4. The substrate treating apparatus of claim 2, wherein the controller is further configured to control the exhaust to increase the exhausting pressure of the treating space at the time of supplying the second liquid to the substrate.

5. The substrate treating apparatus of claim 1, wherein a discharge end of the second liquid nozzle is shielded from allowing the second liquid to contact a second central region of the bottom surface of the substrate.

6. The substrate treating apparatus of claim 1, wherein the controller is further configured to control the exhaust so that the exhausting pressure of the treating space during the supplying of the second liquid is greater than the exhausting pressure of the treating space during the supplying of the first liquid, the exhausting pressure acts in a direction toward a lower side of the substrate, the first liquid is supplied to the top surface on which a pattern is formed, and the second liquid is supplied to the bottom surface.

\* \* \* \* \*